(12) United States Patent
Dai et al.

(10) Patent No.: US 10,347,002 B2
(45) Date of Patent: Jul. 9, 2019

(54) ELECTRONIC TRACKING DEVICE, ELECTRONIC TRACKING SYSTEM AND ELECTRONIC TRACKING METHOD

(71) Applicant: Guangdong Virtual Reality Technology Co., Ltd., Shenzhen, Guangdong Province (CN)

(72) Inventors: Jingwen Dai, Shenzhen (CN); Yongtao Hu, Shenzhen (CN); Jie He, Shenzhen (CN)

(73) Assignee: GUANGDONG VIRTUAL REALITY TECHNOLOGY CO., LTD., Shenzhen, Guangdong Province (CN)

(*) Notice: Subject to any disclaimer, the term of this patent is extended or adjusted under 35 U.S.C. 154(b) by 0 days.

(21) Appl. No.: 15/636,432

(22) Filed: Jun. 28, 2017

(65) Prior Publication Data

US 2018/0005406 A1 Jan. 4, 2018

Related U.S. Application Data

(60) Provisional application No. 62/357,615, filed on Jul. 1, 2016.

(51) Int. Cl.
| | |
|---|---|
| *G06T 7/00* | (2017.01) |
| *G06T 7/70* | (2017.01) |
| *G06T 7/11* | (2017.01) |
| *G06T 5/20* | (2006.01) |
| *G06K 9/46* | (2006.01) |
| *H01L 27/146* | (2006.01) |
| *G06T 7/73* | (2017.01) |

(52) U.S. Cl.
CPC ............ *G06T 7/70* (2017.01); *G06K 9/46* (2013.01); *G06K 9/4604* (2013.01); *G06T 5/20* (2013.01); *G06T 7/11* (2017.01); *G06T 7/73* (2017.01); *H01L 27/14621* (2013.01); *H01L 27/14645* (2013.01); *H01L 27/14649* (2013.01); *G06T 2207/10024* (2013.01)

(58) Field of Classification Search
CPC ..... G06T 7/70; G06T 7/11; G06T 7/73; G06T 5/20; G06T 2207/10024; G06K 9/46; G06K 9/4604; H01L 27/14621; H01L 27/14645; H01L 27/14649; G06F 3/0304
See application file for complete search history.

(56) References Cited

U.S. PATENT DOCUMENTS

| | | | |
|---|---|---|---|
| 2009/0086042 A1* | 4/2009 | Vartiainen | G06F 1/1626 348/211.4 |
| 2014/0062882 A1* | 3/2014 | Ozawa | G06F 3/038 345/158 |

* cited by examiner

*Primary Examiner* — Ping Y Hsieh
(74) *Attorney, Agent, or Firm* — Cheng-Ju Chiang

(57) ABSTRACT

An electronic tracking device includes an image sensor and a processor is provided. The image sensor is configured for sensing a raw image of an object. The object emits a color visible light and an infrared light. The image sensor includes a color filter array so as to sense the color visible light and the infrared light through the color filter array to acquire the raw image. The color filter array includes at least one color filter channel and an infrared filter channel. The processor is configured for processing the raw image so that the identity and the spatial position of the object are determined in accordance with the raw image. An electronic tracking system and method are also provided. By electronic tracking device, system and method, the accurate identification and tracking of objects can be obtained, thereby generating reliable and timely input to VR systems and/or applications.

20 Claims, 9 Drawing Sheets

ELECTRONIC TRACKING DEVICE, ELECTRONIC TRACKING SYSTEM AND ELECTRONIC TRACKING METHOD

CROSS-REFERENCE TO RELATED APPLICATION

This application claims priority to a provisional application No. 62/357,615 filed on Jul. 1, 2016, titled "ELECTRONIC TRACKING METHODS AND DEVICES BASED ON AN IMAGE SENSOR WITH A COLOR FILTER ARRAY". The entirety of the above-mentioned provisional application is hereby incorporated by reference herein.

FIELD OF THE INVENTION

The present disclosure relates to the field of object tracking in general. More particularly, and without limitation, the disclosed embodiments relate to an electronic tracking device, an electronic tracking system and an electronic tracking method.

BACKGROUND OF THE INVENTION

Virtual reality (VR) systems and/or applications typically create a virtual environment in a wearable headset or a mobile device and artificially immerse a user or simulate a user's presence in the virtual environment. To further allow user interaction with the virtual environment, technologies are being developed to allow the user to use their hands to interact with the objects in the virtual environment. Positional information of the hands is desirably detected and input into the VR systems and/or applications. For example, positional tracking methods may be used to track the position and/or movement of the user's hands through tracking controllers held in the hands. In such instances, one or more controllers may be detected, identified, and/or tracked.

For example, each controller may include a light blob that emits visible light, which is detected and tracked by a tracking device. The color of the light may additionally carry the identity information of the controller. However, in such instances, ambient light in the space of the tracking device may add noise to the visible light from the controllers, and thus may affect the accurate detection and/or tracking of the controller. To reduce the interference of ambient light, an infrared light blob may be used for tracking the controllers, but such light blob does not provide the color information for identifying the controller. Although frequency modulation and demodulation of the infrared light blob may be used for identification, such approach may result in a delay in response time, which may affect user experience of the controllers and with the VR systems and applications. Therefore, there is a need for methods and systems that allow for accurate identification and tracking of objects, such as controllers and/or user's hands, to generate reliable and timely input to VR systems and/or applications.

SUMMARY OF THE INVENTION

In accordance with an aspect, the present invention provides an electronic tracking device. The electronic tracking device includes at least one image sensor and at least one processor. The at least one image sensor is configured for sensing a raw image of at least one object, wherein the at least one object emits a color visible light encoding the identity of the at least one object and an infrared light, the at least one image sensor comprises a color filter array so as to sense the color visible light and the infrared light from the at least one object through the color filter array to acquire the raw image of the at least one object, and the color filter array comprises at least one color filter channel and an infrared filter channel. The at least one processor is configured for processing the raw image of the at least one object so that the identity and the spatial position of the at least one object is determined in accordance with the raw image.

In accordance with another aspect, the present invention provides an electronic tracking system. The electronic tracking system includes a light blob generator, at least one image sensor and at least one processor. The light blob generator is configured for forming at least one light blob, wherein the at least one light blob emits a color visible light and an infrared light, and an identification of the at least one light blob is encoded with the color of the color visible light. The at least one image sensor is configured for sensing a raw image of at least one light blob, wherein the at least one image sensor comprises a color filter array so as to sense the color visible light and the infrared light from the at least one light blob through the color filter array to acquire the raw image of the at least one light blob, and the color filter array comprises at least one color filter channel and an infrared filter channel. The at least one processor is configured for processing the raw image of the light blob so that the identity and the spatial position of the at least one light blob is determined in accordance with the raw image.

In accordance with a still another aspect, the present invention provides an electronic tracking method. Firstly, a raw image of at least one object is acquired, wherein the at least one object emits a color visible light encoding the identity of the at least one object and an infrared light, the color visible light and the infrared light from the at least one object passes through a color filter array to be sensed to form the raw image, and the color filter array comprises at least one color filter channel and an infrared filter channel. Then, the raw image of the at least one object is processed so as to determine the identity and the spatial position of the at least one object in accordance with the raw image.

The electronic tracking device, system and method determine the identity and the spatial position of the at least one object in accordance with the raw image sensed through a color filter having at least one color filter channel and an infrared filter channel. Thus, accurate identification and tracking of objects, such as controllers and/or user's hands can be obtained, thereby generating reliable and timely input to VR systems and/or applications.

BRIEF DESCRIPTION OF THE DRAWINGS

The accompanying drawings, which are incorporated in and constitute a part of this specification, illustrate exemplary embodiments of the present disclosure, and together with the description, serve to explain the principles of the disclosure.

DETAILED DESCRIPTION OF PREFERRED EMBODIMENTS

Figure 1:
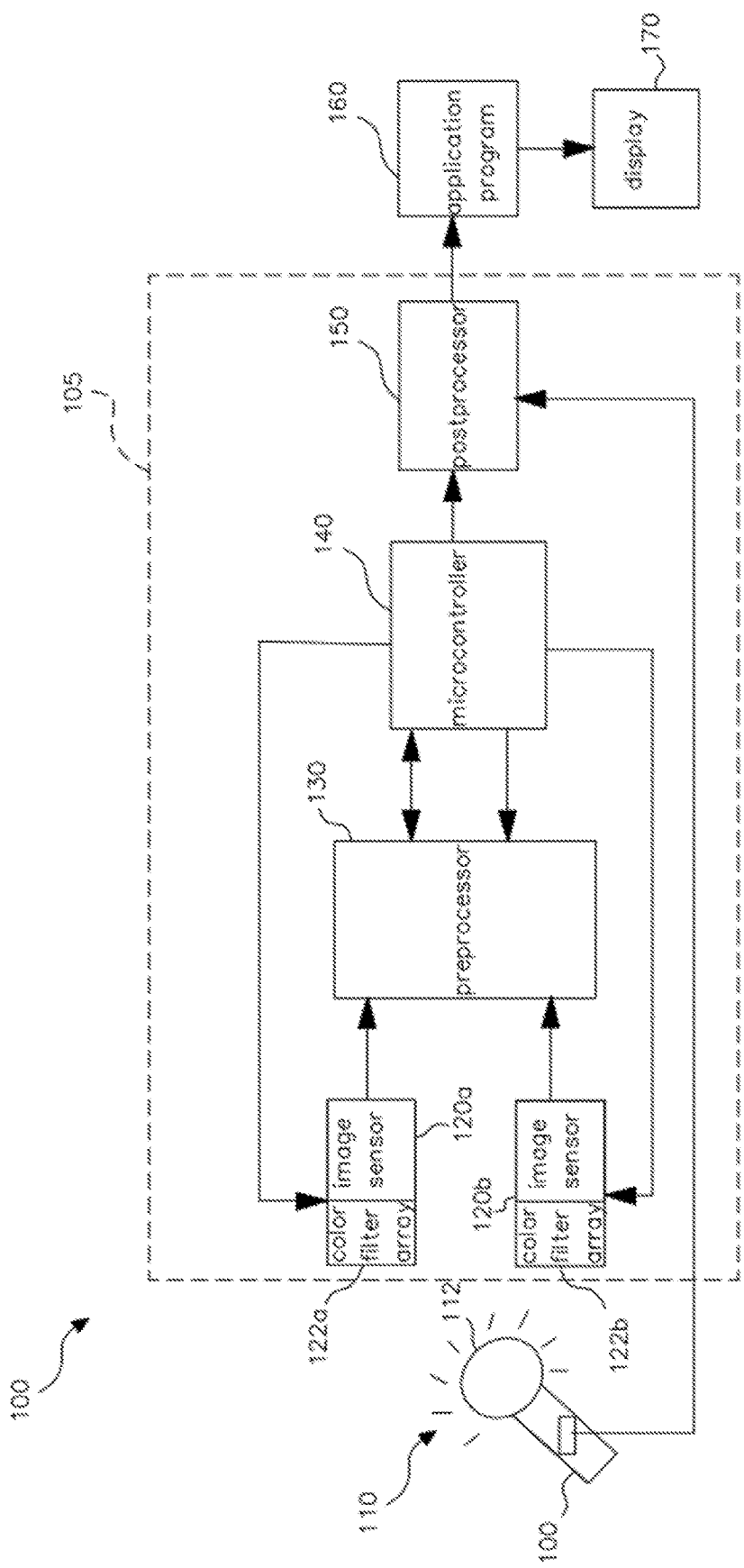
FIG. 1 is a schematic representation of an exemplary electronic tracking system, according to embodiments of the present disclosure.

This description and the accompanying drawings that illustrate exemplary embodiments should not be taken as limiting. Various mechanical, structural, electrical, and operational changes may be made without departing from the scope of this description and the claims, including equivalents. In some instances, well-known structures and techniques have not been shown or described in detail so as not to obscure the disclosure. Similar reference numbers in two or more figures represent the same or similar elements. Furthermore, elements and their associated features that are disclosed in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

The disclosed embodiments relate to systems and methods for achieving electronic and/or automatic tracking of an object (e.g., a controller) having a light blob by allowing for determining the identity and spatial position of the light blob. Embodiments of the present disclosure may be implemented in a VR system for detecting and tracking a controller and/or a user's hands or any suitable part of a user's body. Alternatively, embodiments of the present disclosure may be implemented in an electronic system that needs the capability to track an object.

According to an aspect of the present disclosure, the light blob may have one or more narrow emission spectra. The light blob may emit both visible and infrared light. For example, the light blob may emit visible light of one or more colors, such as red, green, and/or blue, and infrared light, such as near infrared light. According to another aspect of the present disclosure, an image sensor with a color filter array, such as a RGB-IR filter array, is used for detecting and tracking the light blob. Advantageously, the color filter array may have filter elements with predetermined passbands to allow the image sensor to differentiate visible light of one or more colors and infrared light. For example, red, blue, and/or green light may be captured through different color filter channels of the color filter array to separate color information, and infrared light may be captured through an infrared filter channel of the color filter array. Advantageously, exemplary embodiments allow for accurate and automated identification and tracking of the object and/or the light blob by utilizing visible and infrared light from the light blob.

Reference will now be made in detail to embodiments and aspects of the present disclosure, examples of which are illustrated in the accompanying drawings. Where possible, the same reference numbers will be used throughout the drawings to refer to the same or like parts. Those of ordinary skill in the art in view of the disclosure herein will recognize that features of one or more of the embodiments described in the present disclosure may be selectively combined or alternatively used.

FIG. 1 illustrates a schematic representation of an exemplary electronic tracking system 100, according to embodiments of the present disclosure. As shown in FIG. 1, system 100 may include an electronic tracking device 105 and an object 110 having a light blob 112. Object 110 may be an input device for a user to control a video game or a machine, or to interact with an artificial environment. For example, object 110 may be a controller or a joystick. Electronic tracking device 105 may include one or more image sensors, such as image sensors 120a and 120b, and one or more processors. System 100 may further include other electronic elements, such as non-transitory computer-readable medium, data transmission and/or receiving modules, electronic connections and interface ports, system status indicators, etc.

In some embodiments, system 100 may include more than one object 110. Each object 110 may have a light blob 112 installed thereon. The light blobs 112 on different objects 110 may be configured to emit light of different colors, thereby encoding a unique identification of an object with the color of the light blob installed on the particular object. Object 110 may further include an inertial measurement unit (IMU) 114 that measures movement information, such as acceleration, rotation, and/or orientation of object 110. IMU 114 may report the movement information of the object to electronic tracking device 105 for further processing and/or tracking object 110 and/or light blob 112.

Image sensors 120a and 120b may be a CCD or CMOS sensor or camera, or any other suitable types of sensor arrays. Image sensors 120a and 120b may each acquire or capture a raw image of object 110 and/or light blob 112. The raw images acquired by both image sensors may be used to determine the position of object 110 and/or light blob 112 in a three-dimensional (3-D) space. The size of the raw images may be the same or smaller as that of the size of the image sensor 120a and 120b. In some embodiments, at least one of image sensors 120a and 120b may include a color filter array installed thereon to distinguish light of different colors. For example, image sensor 120a has a color filter array 122a and image sensor 120b has a color filter array 122b.

Figure 2A:
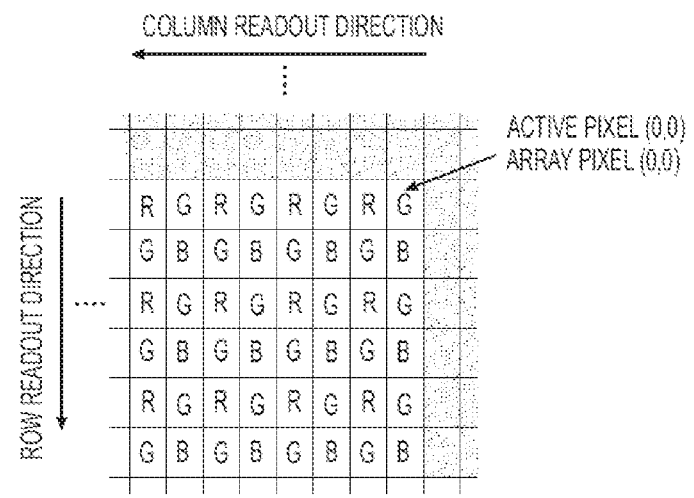
FIG. 2A is a graphical illustration for an exemplary RGB color filter array of an image sensor.

FIG. 2A graphically illustrates an exemplary color filter array, e.g., a Bayer array. As shown in FIG. 2A, the Bayer array may include alternating red, green, and blue filter elements that substantially permit transmission of red, green, and blue light respectively, corresponding to three filter channels of the Bayer array or the image sensor having the Bayer array. The Bayer array also includes twice as many green as red or blue filter elements.

Color filter arrays, such as the Bayer array, allow an image sensor to separate light of different colors and capture color-channel images. Therefore, light blob 112 emitting light of a particular color may be distinguished using image sensor 120a or 120b with a color filter array, and may be further identified and/or tracked based on its color and/or shape detected in an color-channel image of light blob 112. However, visible ambient light in the space where object 110 and/or light blob 112 are located, such as sun light, and light emitted by lighting devices, including LED bulbs, incandescent light bulbs and/or fluorescent lamp, may have wavelengths similar to those of the visible light emitted by light blob 112, and may affect the accurate identification and tracking of object 110 and/light blob 112.

Figure 2B:
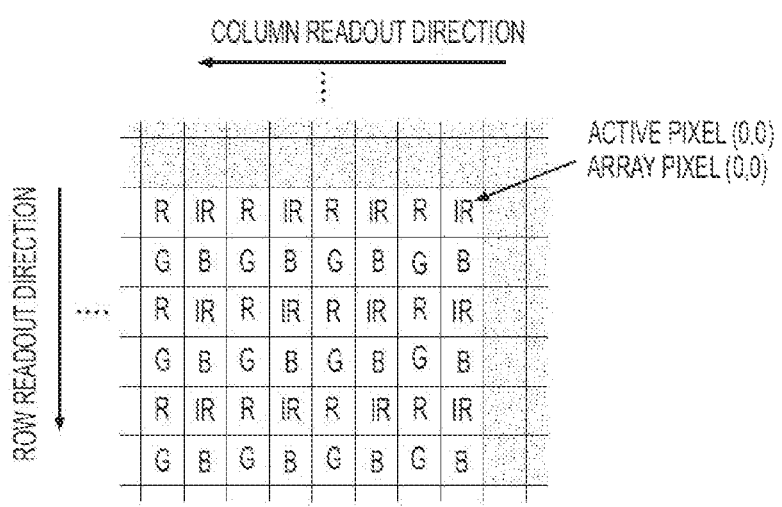
FIG. 2B is a graphical illustration for an exemplary RGB-IR color filter array of an image sensor, according to embodiments of the present disclosure.

Advantageously, embodiments of the present disclosure use image sensors 120a and 120b having a RGB-IR color filter array 122a or 122b. FIG. 2B graphically illustrates RGB-IR color filter array 122a or 122b, according to embodiments of the present disclosure. As shown in FIG. 2B, unlike a typical color filter array, such as a Bayer array, RGB-IR color filter array 122a or 122b includes alternating infrared filter elements that substantially permit transmission of infrared ("IR") light, such as near-infrared ("NIR") light, corresponding to a fourth infrared filter channel. Each filter element of RGB-IR color filter array 122a or 122b may be place over a pixel of image sensor 120a or 120b. Therefore, light blob 112 that emits infrared light can be identified and imaged by image sensor 120a or 120b having RGB-IR color filter array 122a or 122b. The captured infrared light may advantageously provide additional characteristic information for identifying and/or tracking light blob 112 and/or object 110.

As described herein, image sensor 120a may have similar types and features as those of image sensor 120b. Descriptions of the features below in references to image sensor 120a are equally applicable to image sensor 120b. Similarly, descriptions of the features below in references to RGB-IR color filter array 122a are equally applicable to RGB-IR color filter array 122b.

Figure 3:
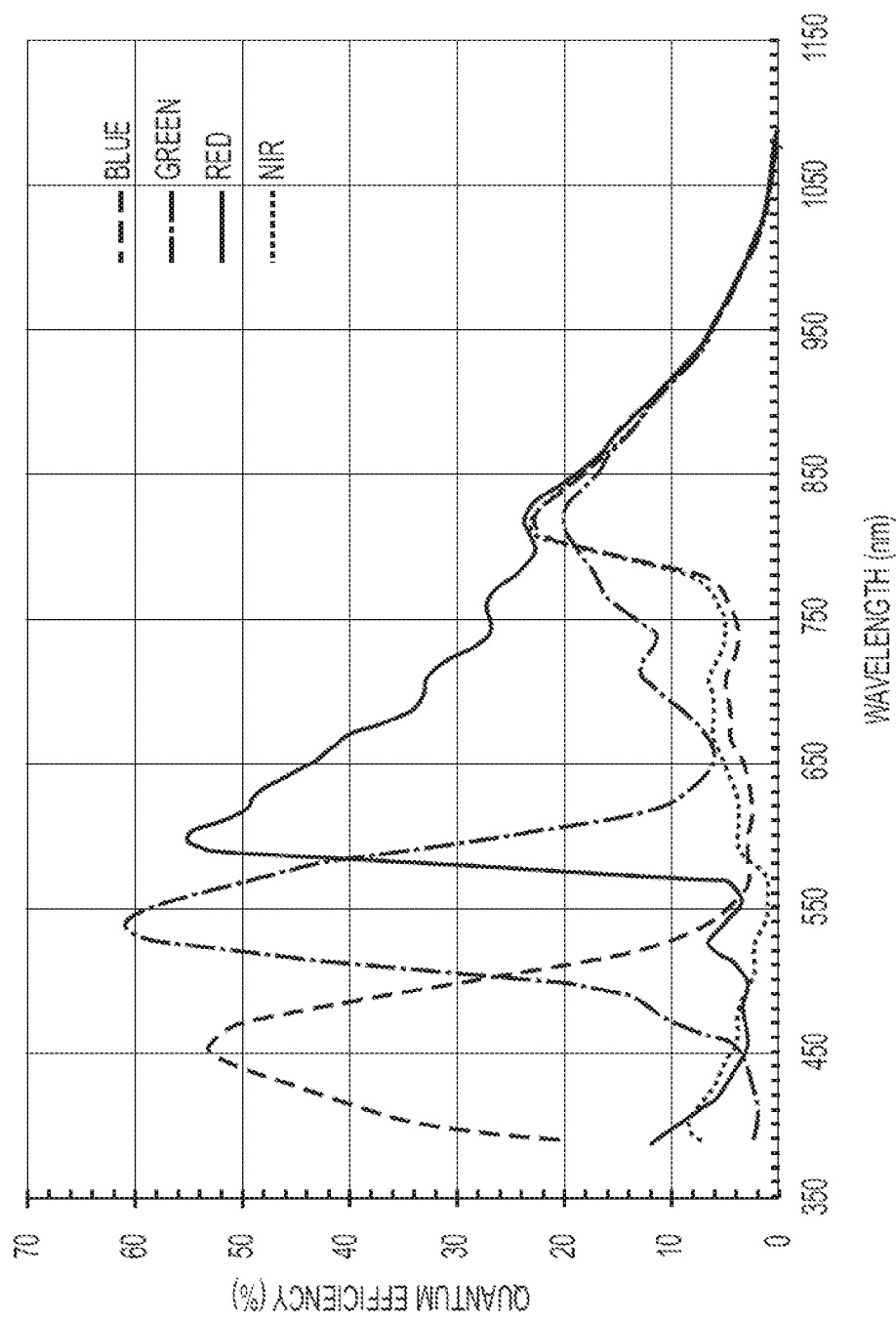
FIG. 3 is a graphical illustration for exemplary responses as a function of wavelength for four different channels of an exemplary image sensor, according to embodiments of the present disclosure.

FIG. 3 graphically illustrates exemplary responses of image sensor 120a having RGB-IR filter array 122a as a function of wavelength corresponding to four different filter channels (e.g., R, G, B, and IR). As described herein, the response of image sensor 120a may be described in reference to the quantum efficiency of its pixels, which may refer to the percentage of the number of electrons per photon hitting the image sensor's photoreactive surface or per watt. As described herein, red, green, and blue are selected as exemplary colors for illustrating of the features of RGB-IR filter array 122a and image sensor 120a. Any suitable selection of different filter channels having different spectral transmission regions may be desirably selected based on the application of image sensor 120a. Additionally, infrared light may refer to light having any suitable invisible infrared radiation, such as near-infrared light, short-wavelength infrared light, mid-wavelength infrared light, long-wavelength infrared light, far-infrared light, etc. For illustration purposes, pixels of image sensor 120a placed below filter elements of RGB-IR filter array 122a, e.g., R, G, or B, may be referred to as color pixels or color channels of image sensor 120a. Pixels of image sensor 120a placed below infrared filter elements of RGB-IR filter array 122a, e.g., IR, may be referred to as infrared pixels or infrared channel of image sensor 120a.

Ideally, each filter channel of RGB-IR filter array 122a may transmit only the wavelengths of the passband of that filter channel, and each pixel or channel of image sensor 120a may respond to only the wavelengths of the passband of the corresponding filter channel. However, in practical situations, the transmission or response may gradually decrease for wavelengths outside the passband of a filter channel. For example, as shown in FIG. 3, the response or quantum efficiency of an image sensor having RGB-IR filter array 122a for red color is nonzero at blue and green regions. Therefore, blue and green light, such as light having wavelengths around 450 nm or 550 nm, may also contribute to the light intensity recorded by the pixels of the image sensor below the red filter elements ("red pixels"). Similarly, green and red light may contribute to the light intensity recorded by the pixels of the image sensor below the blue filter elements ("blue pixels"), and blue and red light may contribute to the light intensity recorded by the pixels of the image sensor below the green filter elements ("green pixels").

Similarly, red, green, and/or blue light may contribute to the light intensity recorded by the pixels of the image sensor below the infrared filter elements ("infrared pixels" or "infrared channel"). For example, the quantum efficiency or response of infrared pixels at the wavelength of 650 nm may be about $\frac{1}{5}$ of that of the red pixels at its peak response wavelength, the quantum efficiency or response of infrared pixels at the wavelength of 550 nm may be about $\frac{1}{12}$ of that of the green pixels at its peak response wavelength, and the quantum efficiency or response of infrared pixels at the wavelength of 450 nm may be about $\frac{1}{5}$ of that of the blue pixels at its peak response wavelength. Additionally, as shown in FIG. 3, red, green, and blue pixels may respond or have nonzero quantum efficiency in the infrared region, such as wavelengths at about 850 nm.

Advantageously, light blob 112 that emits visible light and infrared light may generate strong response in both color pixels and infrared pixels of image sensor 120a. Accordingly, light intensity detected in both types of pixels or channels of image sensor 120a may be used for identifying and tracking light blob 112 and/or object 110 as described further below.

Figure 4A:
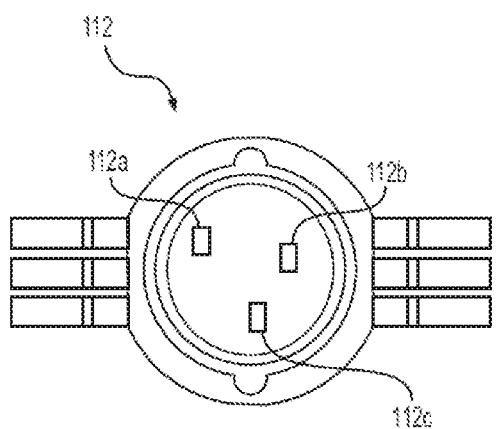
FIG. 4A is a top view of an exemplary light blob, according to embodiments of the present disclosure.
Figure 4B:
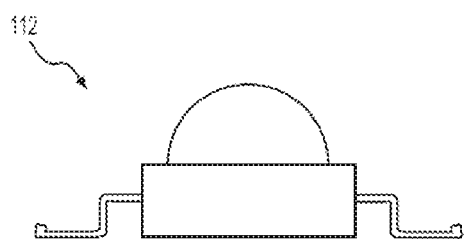
FIG. 4B is a side view of the exemplary light blob of FIG. 4A.
Figure 4C:
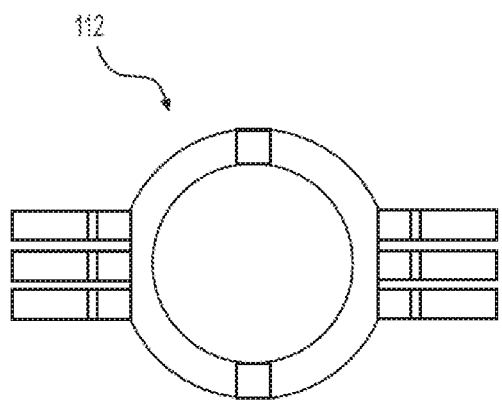
FIG. 4C is a bottom-up view of the exemplary light blob of FIG. 4A.

FIG. 4A is a top view of an exemplary light blob 112, according to embodiments of the present disclosure. FIG. 4B is a side view and FIG. 4C is a bottom-up view of light blob 112 of FIG. 4A. As shown in FIGS. 4A-4C, light blob 112 may include one or more LEDs, such as LEDs 112a, 112b, and 112c. The LEDs are packaged inside a bulb or a blob of light blob 112. Each LED may have a positive pin and a negative pin. The LEDs may be selected to emit visible light of a desired color and infrared light. For example, LED 112a may emit green light, LED 112b may emit blue light, and LED 112c may emit infrared light. The number of LEDs of light blob 112 may be increased or decreased as desired. For example, to increase the number of different light blobs 112 with different identities (IDs), more color LEDs may be used for carrying ID information. A selected combination of the LEDs may simultaneously emit light of one or more colors, and the colors may be added together to produce a characteristic color corresponding to a unique ID of a particular light blob 112 and/or the corresponding object 110.

As shown in FIG. 1, the one or more processors of system 100 may include a preprocessor 130, a microcontroller 140, and a postprocessor 150. In some embodiments, preprocessor 130 may receive a raw image of light blob 112 acquired by image sensor 120a. Preprocessor 130 may perform preprocessing operations to further obtain one or more preprocessed color-channel images of light blob 112 corresponding to the color channels of image sensor 120a, and an infrared-channel image of light blob 112 corresponding to the infrared channel of image sensor 120a from the raw image. For example, preprocessor 130 may obtain one or more color-channel images and infrared-channel image of light blob 112 by traversing the raw image and selecting the pixels of a particular channel. Preprocessor 130 may further perform filtering or scaling of the obtained images to obtain refined color-channel images and refined infrared-channel image of light blob 112. Preprocessor 130 may be a processor selected from a group of processors, including an application-specific integrated circuit (ASIC), a field-programmable gate array (FPGA), a complex programmable logic devices (CPLD), and an ARM-based processor. Operations for preprocessing the raw image acquired by image sensor 120a are described further below.

As described herein, the operations performed by two or more of the processors of system 100 may be combined and performed by one processor. Alternatively, the operations performed by one processor of system 100 may be separated and performed by two or more processors of system 100.

In some embodiments, microcontroller 140 controls the operation of image sensors 120a and 120b. For example, microcontroller 140 may initialize or set parameters of image sensors 120a and 120b for acquiring the raw images of light blob 112. Such parameters of the image sensors may affect the features and the processing operations of the raw images of light blob 112 acquired by image sensors 120a and 120b, such as the size, intensity, shape, segment, etc. The parameters may include intrinsic and/or extrinsic parameters. The intrinsic parameters may include exposure time, acquisition time, focal length, focal point, quantum efficiency of each pixel or channel, the distance between/among the sensors, etc. The extrinsic parameters may include the rotation, spatial separation, translation, etc., of the image sensors. In some situations, microcontroller 140 may further receive external input, such as additional parameters or values of the extrinsic parameters, to set the intrinsic parameters of the image sensors 120a and 120b. Additionally, microcontroller 140 may further control other electronic elements of system 100, such as data transmission modules, data communication interface, other suitable processors, system status indicators, computer-readable media (e.g., memories), etc.

In some embodiments, microcontroller 140 may receive the one or more preprocessed color-channel images and the preprocessed infrared-channel image of light blob 112 obtained by preprocessor 130 and may send these preprocessed images to postprocessor 150. Postprocessor 150 may perform postprocessing operations to determine the identity and/or the spatial position of light blob 112 through a series of operations on the preprocessed color-channel images and infrared-channel images as described further below.

In some embodiments, postprocessor 150 may be part of microcontroller 140. In other embodiments, postprocessor 150 may be part of a mobile computing device. In such instances, postprocessor 150 may include one or more processors selected from a central processor unit (CPU), a graphics processing unit (GPU), and a digital signal processor (DSP) of a mobile computing device. Postprocessor 150 may send the obtained identity and/or spatial position information to an application program 160 on the mobile computing device, which may send the information to a display 170 of the mobile computing device. Display 170 may show an artificial representation of object 110 and/or light blob 112 in a virtual environment, and/or user interaction with the virtual environment through object 110, e.g., a controller or a joystick.

Figure 5:
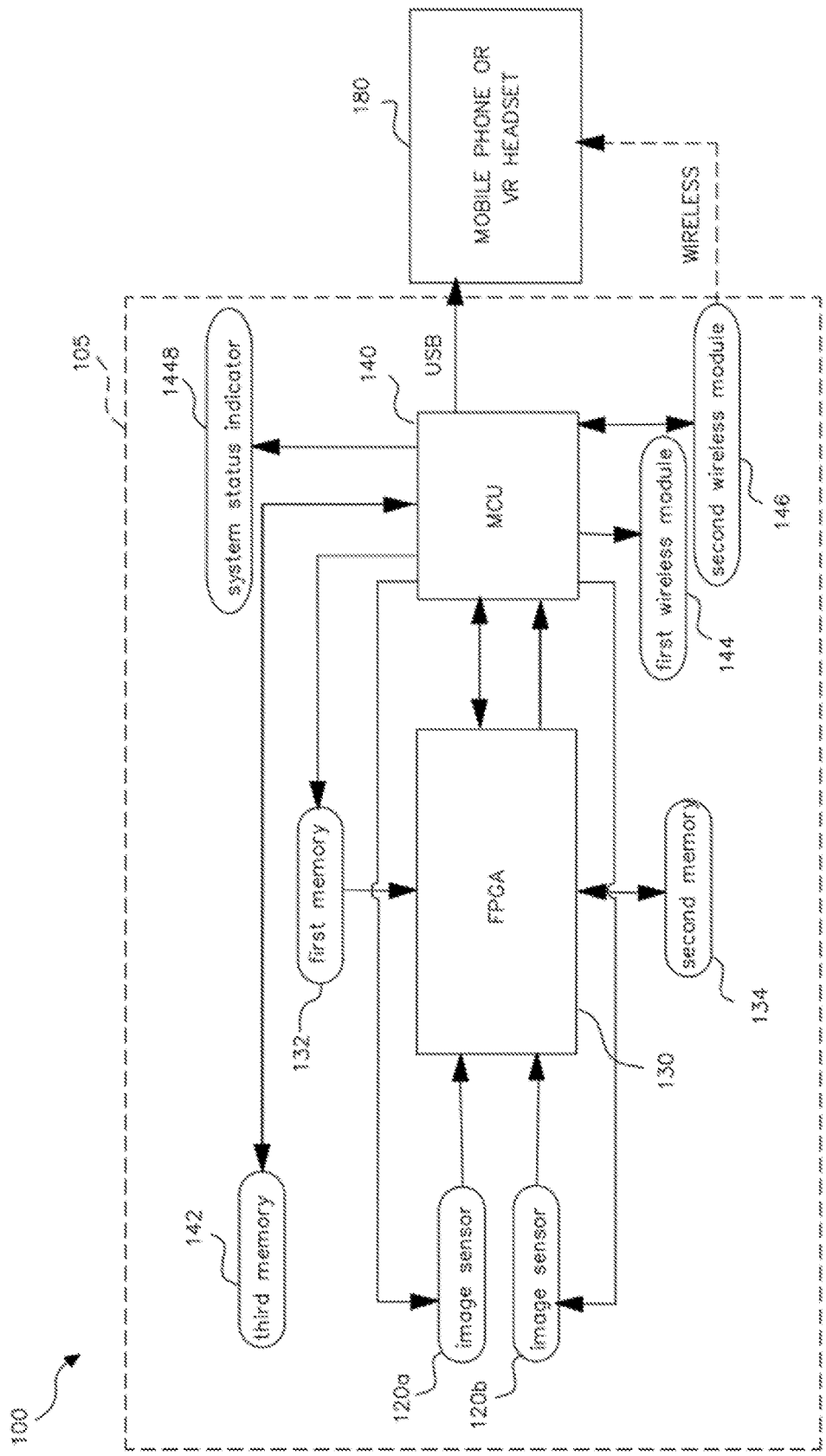
FIG. 5 is a schematic representation of another exemplary electronic tracking system, according to embodiments of the present disclosure.

FIG. 5 graphically illustrates a schematic representation of another exemplary electronic tracking system 100, according to embodiments of the present disclosure. As shown in FIG. 5, system 100 may further include a mobile computing device 180, e.g., a mobile phone or a VR headset, and one or more computer-readable storage media or non-transitory memories. The computer-readable storage media may be operatively connected to the processors, and may be selected from a group including a flash memory, a RAM, a ROM, an EPROM, an EEPROM, an FeRAM, an MRAM, a DDR SDRAM, a DDR2 SDRAM, a DDR3 SDRAM, and a DDR4 SDRAM.

In some embodiments, as shown in FIG. 5, preprocessor 130 may be operatively connected to a first memory 132 and a second memory 134. First memory 132 may be a flash memory. First memory 132 may store the preprocessing operations of preprocessor 130. Second memory 134 may be a DDR3 SDRAM. Second memory 134 may work as a data buffer to store the raw images acquired by image sensors 120a and/120b, intermediate images during the preprocessing operations of preprocessor 130, and/or preprocessed images to be output by preprocessor 130.

In some embodiments, as shown in FIG. 5, microcontroller 140 may be operatively connected to a third memory 142. Third memory 142 may be an EEPROM and may store control operations of microcontroller 140, and/or parameters of image sensors 120a and 120b. When postprocessor 150 is part of microcontroller 140, third memory 142 may further store postprocessing operations of postprocessor 150.

As shown in FIG. 5, system 100 may further include one or more modules for wired or wireless connection between the electronic elements in system 100 for data transmission or communications. The wired or wireless connection module may include a USB interface module, a Bluetooth module (BT module), and a radio frequency module (RF module) (e.g., Wi-Fi 2.4 GHz module). For example, microcontroller 150 may be operatively connected to a first wireless module 144 and/or a second wireless module 146. First wireless module 144 and second wireless module 146 may use different protocols for data transmission. The wireless modules may be used for sending data including control operations and parameters to object 110 (e.g., a controller), preprocessed and/or postprocessed images of object 110 and/or light blob 112, and/or identity and/or spatial position information of object 110 and/or light blob 112 to other electronic devices (e.g., mobile computing device 180). Additionally or alternatively, such data may be transmitted via a wired connection, e.g., via a USB port.

Figure 6:
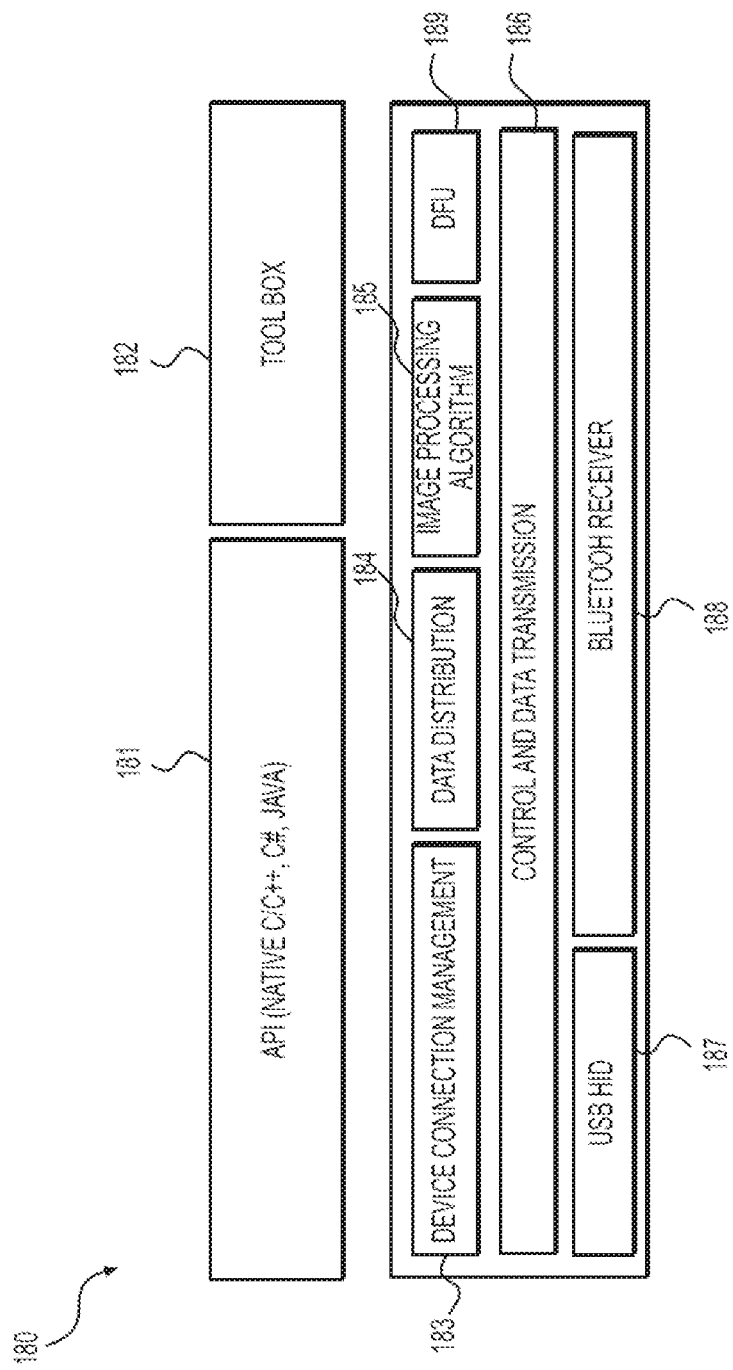
FIG. 6 is a block diagram of exemplary program modules of an exemplary mobile computing device, according to embodiments of the present disclosure.

In some embodiments, mobile computing device 180 may include suitable program modules that perform additional operations. FIG. 6 is a block diagram of exemplary program modules of mobile computing device 180, according to embodiments of the present disclosure. The program modules may obtain the preprocessed images of preprocessor 130, postprocessed images of postprocessor 150 (which may be part of mobile computing device 180), measurement data obtained by IMU 114 from microcontroller 150, and/or identity and/or spatial position information of object 110 and/or light blob 112. The program modules may further control the connection of electronic tracking device 105 with mobile computing device 180, and/or the testing and upgrading of electronic tracking device 105. Additionally, the program modules may perform the postprocessing operations for identifying and tracking object 110 and/or light blob 112. In some embodiments, system 100 may further include a system status indicator 148 that indicates its operational status, such as an operation state or an idle state.

As shown in FIG. 6, the program modules of mobile computing device 180 may include a software development kit (SDK) for developers. The SDK may include an application programming interface (API) module 181 and a toolbox 182. API module 181 may include one or more libraries of a programming language, e.g. Native C, C++, C#, and Java. The SDK may receive one or more parameters and data from microcontroller 140 via a wired or wireless connection, such as a USB or Bluetooth interface. For example, the SDK may receive preprocessed or postprocessed images, parameters of image sensors 120*a* and 120*b*, measurement data acquired by IMU 144, and/or external input. The SDK may provide information of the identity and/or spatial position of object 110 and/or light blob 112 to application 160 of mobile computing device 180, allowing system 100 to be used in different operation platforms or systems, such as Android, Windows, and Unity 3D engine. The programming language of API module 181 may be selected based on the operation platform or system. Toolbox 182 may be used to assist developers, and may include device testing tools, device debugging tools, device upgrading tools, Android toolbox, and/or Mobile or PC Windows toolbox.

As shown in FIG. 6, mobile computing device 180 may further include background service program modules, such as a device connection management module 183, a data distribution module 184, an image processing algorithm module 185, a control and/or data transmission module 186, a USB HID module 187, a Bluetooth receiver and/or transmission module 188, and/or a device firmware upgrade module (DFU) 189. One or more of these modules may be operated by postprocessor 150 or any selection of suitable processors of mobile computing device 180 described above.

Figure 7:
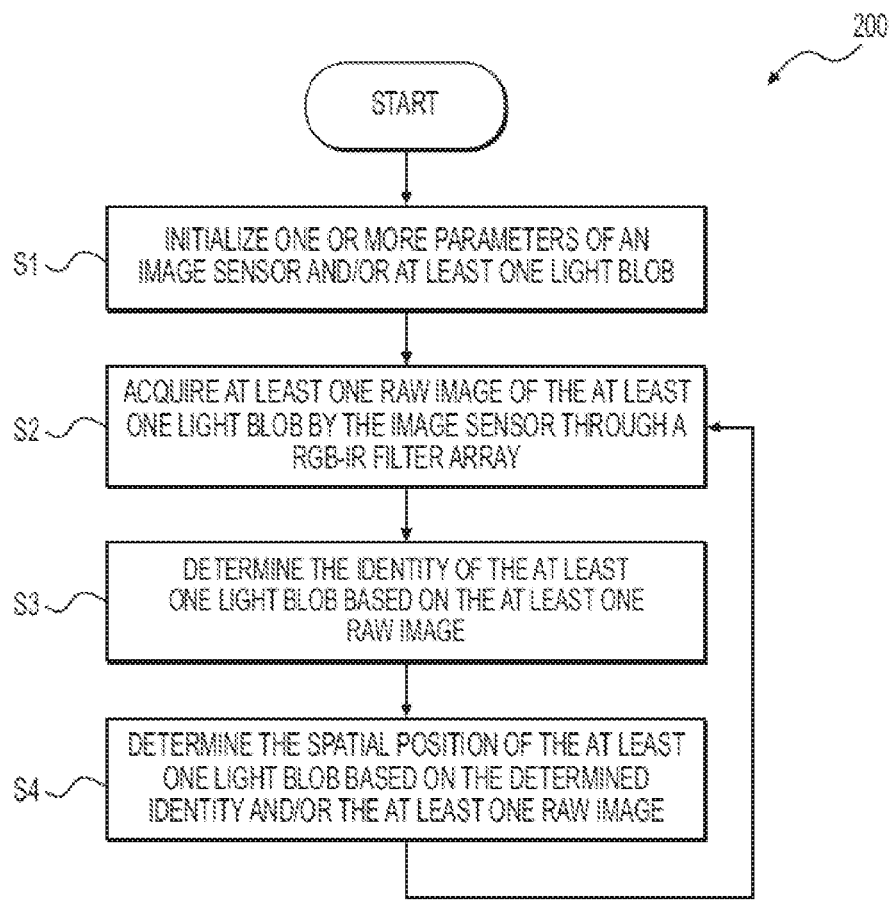
FIG. 7 is a flowchart of an exemplary method for tracking an exemplary light blob, according to embodiments of the present disclosure.

System 100 as described herein may be utilized in a variety of methods for object tracking. FIG. 7 is a flowchart of an exemplary method 200 for tracking light blob 112, according to embodiments of the present disclosure. Method 200 uses system 100 and features of the embodiments of system 100 described above in reference to FIGS. 1-6.

As shown in FIG. 7, in step S1, system 100 may be configured to initialize one or more parameters of image sensors 120*a* and/or 120*b*. System 100 may also be configured to initialize, determine, and/or set various parameters, e.g., the emission wavelengths, of light blob 112. Various parameters of image sensors 120*a* and/or 120*b* are described above. For example, system 100 may be configured to set suitable exposure time for different color pixels and/or infrared pixels based on the color and strength of ambient light. System 100 may be configured to set the color of light blob 112 based on the ambient light and/or the number of objects 110 to be detected and tracked.

In step S2, system 100 may be configured to acquire a raw image of light blob 112, consistent with disclosed embodiments. For example, microcontroller 140 may control image sensors 120*a* to acquire one or more raw images through RGBIR filter array 122*a*, which may be sent to preprocessor 130. The raw images may capture both visible light and infrared light emitted from light blob 112.

In step S3, system 100 may be configured to determine the identity of light blob 112 based on one or more raw images, consistent with disclosed embodiments. In some aspects, step S3 is performed in real-time as a user interacts with a virtual environment such that the identity of light blob 112 may be fed back in real-time to a wearable headset or a mobile device, e.g., mobile computing device 180. Step S3 for determining the identity light blob 112 may be implemented in various suitable manners. For example, step S3 may further include the operational steps as described below in reference to FIGS. 8A and 8B respectively. The operations steps of step S3 can be performed by preprocessor 130.

Figure 8A:
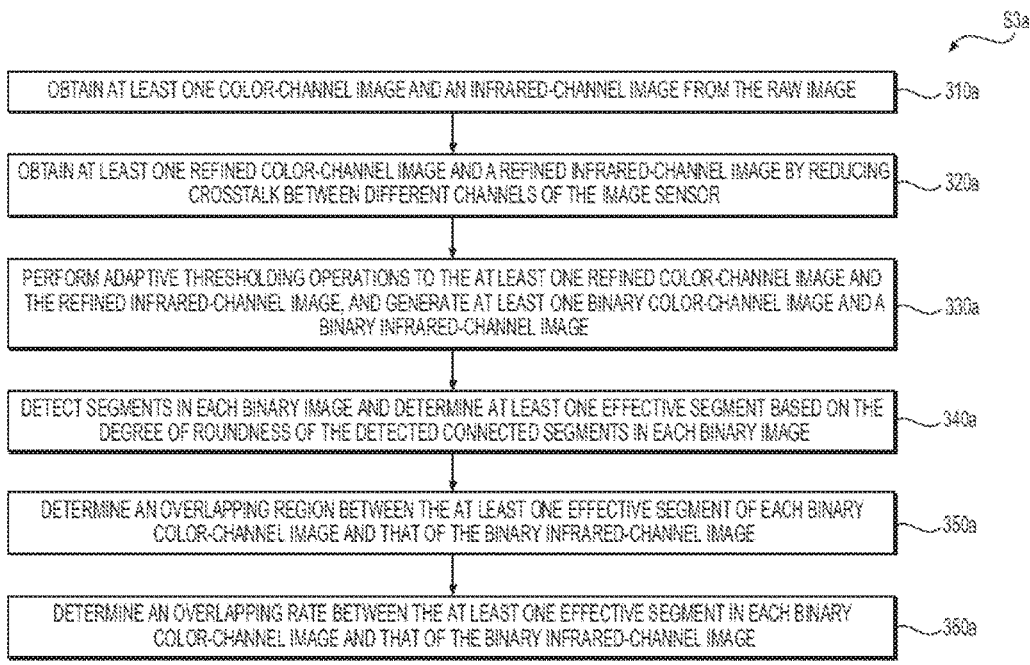
FIG. 8A is a flowchart of an exemplary method for determining the identity of an exemplary light blob, according to embodiments of the present disclosure.

As a non-limiting example, FIG. 8A is a flowchart of an exemplary method S3*a* for determining the identity the exemplary light blob, according to embodiments of the present disclosure. As described above, red, green, and blue are used in this disclosure as exemplary colors of the light emitted by light blob 112. Descriptions in references to red, green, and blue are equally applicable to other selected colors consistent with the embodiments of this disclosure. As described herein, "color" may refer a suitably selected color of visible light, such as red, green, and blue, which may be labeled as "r" or "red," "g" or "green," and "b" or "blue" for the purpose of description.

As shown in FIG. 8A, in step 310*a*, system 100 may be configured to obtain at least one color-channel image and an infrared-channel image from the raw image of image sensor 120*a*. For example, preprocessor 130 may be used to split a raw image acquired by image sensor 120*a* having RGB-IR color filter array 122*a* into a red-channel image (raw_r), a green-channel image (raw_g), a blue-channel image (raw_b), and an infrared-channel image (raw_ir). Preprocessor 130 may perform operations that traverse the rows and columns of the pixels of image sensor 120*a* by a step of 2 pixels in accordance with the layout of the filter channels of the RGB-IR color filter array 122*a*. Consequently, the sizes of the color-channel images and infrared-channel image may be about ¼ of the raw image, for example.

In step 320*a*, system 100 may be configured to process the at least one color-channel image and infrared-channel image through a set of filtering operations to obtain at least one refined color-channel image (e.g., r_refine, g_refine, b_refine) and a refined infrared-channel image (e.g., ir_refine) by reducing crosstalk between different channels of the image sensor. As described above, because the response for each filter channel of image sensor 120*a* is nonzero, wavelengths of light outside the passband of a filter channel may add noise to the intensity of light detected in the particular filter channel. Therefore, step 320*a* may be used to reduce the interference, crosstalk, and/or noise caused by light with wavelengths outside a particular filter channel of image sensor 120*a*.

Preprocessor 130 may perform the operations to reduce the interference or noise by multiplying the intensity values of the color-channel images and infrared-channel images by a filtering matrix according to equation (1) below:

$$(r\_refine \ g\_refine \ b\_refine \ ir\_refine) = (raw\_r \ raw\_g \ raw\_b \ raw\_ir) \times f,$$

where raw_r represents red-channel image, raw_g represents green-channel image, raw_b represents blue channel image, and raw_ir represents infrared channel image obtained from the raw image, and f represents a denoising filtering matrix, r_refine represents the filtered refined red-channel image, g_refine represents the filtered refined green-channel image, b_refine represents the filtered refined blue-channel image, ir_refine represents the filtered infrared-channel image. Denoising matrix f may be represented by the following equation:

$$f = \begin{bmatrix} f_{11} & f_{12} & f_{13} & f_{14} \\ f_{21} & f_{22} & f_{23} & f_{24} \\ f_{31} & f_{32} & f_{33} & f_{34} \\ f_{41} & f_{42} & f_{43} & f_{44} \end{bmatrix}.$$

The size of matrix may be determined by the size of the color-channel images and infrared-channel image. Each parameter $f_{ij}$ of the matrix may range from about −1 to about 1, and may be predetermined based on various parameters of image sensor 120a, such as the quantum efficiency responses of different filter channels of image sensor 120 as shown in FIG. 3, and/or various parameters of light blob 112, such as wavelengths and intensity.

As would be understood by one of skill in the art, the particular form of the equations described herein is not intended to be limiting.

In step 330a, system 100 may be configured to perform adaptive thresholding operations to the at least one refined color-channel image and the refined infrared-channel image, and generate at least one binary color-channel image and a binary infrared-channel image. In this step, if the intensity of a pixel in the refined image is less than a predetermined threshold value obtained from the adaptive thresholding, the pixel is replaced with a black pixel or its intensity is designated as zero, or a white pixel if the intensity is greater than the predetermined threshold value.

In step 340a, system 100 may be configured to detect segments in each binary image and determine at least one effective segment based on the degree of roundness of the detected connected segments in each binary image. For example, a degree of roundness may be calculated for each of the detected segments in the binary color-channel images and the binary infrared-channel image according to equation (2) below:

$$e = \frac{4\pi \times \text{area}}{\text{circumference}^2} \quad (2)$$

wherein e represents the calculated degree of roundness, which is then compared to a roundness threshold k. If e is greater than the roundness threshold, the detected segment is deemed as an effective segment; otherwise, the detected segment is not used for the following steps. The value for the roundness threshold k may be a rational number ranging from about 0 to about 1, e.g., 0.6.

In step 350a, system 100 may be configured to determine an overlapping region between the effective segment of each binary color-channel image and the effective segment of the binary infrared-channel image. For example, system 100 may perform logic and between the binary green-channel image and the binary infrared-channel image and obtain one or more overlapping regions of the effective segments in the two binary images. Similarly, system 100 may perform logic and between other binary color-channel images and the binary infrared-channel image to obtain the overlapping regions for each color-channel image.

In step 360a, system 100 may be configured to determine an overlapping rate between the effective segments in each binary color-channel image and that of the binary infrared-channel image. Because light blob 112 emit both visible color light and infrared light, effective segments in the binary color-channel images that correspond to light blob 112 would have responses in both color pixels and infrared pixels. Therefore, to determine the color of the visible light emitted by light blob 112, which represents the identity of light blob 112, an overlapping rate between the effective segments in each binary color-channel image and the effective segments of the binary infrared-channel can be determined. For example, the overlapping rate can be determined as the ratio between the area of the effective segment detected in a binary color-channel image and that of the effective segment detected in the binary infrared-channel image. The determined overlapping rate for each color-channel may then be compared to a overlapping rate threshold $\partial$ according to equation (3) below:

$$\frac{\text{Area}(r)}{\text{Area}(ir)} > \partial \quad (3)$$

wherein the value for $\partial$ may be a rational number ranging from about 0 to about 1, e.g., 0.6. If the overlapping ratio for a particular color channel satisfies equation (3), then the visible light emitted by light blob 112 corresponds to the color of the color channel, thereby representing the identity of light blob 112. The positions of light blob 112 in the acquired-channel images may also then obtained through suitable image operations.

After the identity of light blob 112 is obtained in the raw images acquired by both sensors 120a and 120b, based on the identity of light blob 112 and/or the raw images, suitable 3D position tracking or determination methods are used to determine the spatial position of light blob 112. The spatial position of light blob 112 may then be sent to a mobile computing device.

Figure 8B:
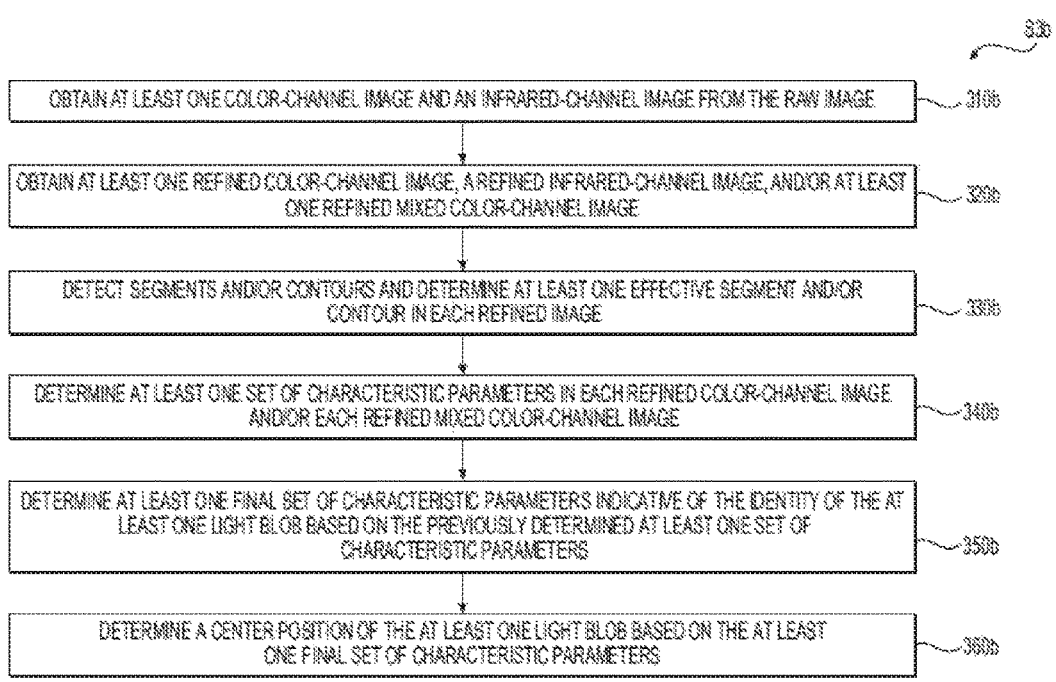
FIG. 8B is a flowchart of another exemplary method for determining the identity of an exemplary light blob, according to embodiments of the present disclosure.

As a further non-limiting example, FIG. 8B is a flowchart of another exemplary method S3b for determining the identity of light blob 112, according to embodiments of the present disclosure. Similar to step 310a, in step 310b, system 100 may be configured to obtain at least one color-channel image and an infrared-channel image from the raw image of image sensor 120a. For example, preprocessor 130 may be used to split a raw image acquired by image sensor 120a having RGB-IR color filter array 122a into a red-channel image (raw_r), a green-channel image (raw_g), a blue-channel image (raw_b), and an infrared-channel image (raw_ir). Preprocessor 130 may perform operations that traverse the rows and columns of the pixels of image sensor 120a by a step of 2 pixels in accordance with the layout of the filter channels of the RGB-IR color filter array 122a. Consequently, the sizes of the color-channel images and infrared-channel image may be about ¼ of the raw image, for example.

Similar to step 320a, step 320b may be used to reduce the interference, crosstalk, and/or noise caused by light with wavelengths outside a particular filter channel of image sensor 120a. In step 320b, system 100 may be configured to process the at least one color-channel image and infrared-channel image through a set of filtering operations to obtain at least one refined color-channel image (e.g., r_refine, g_refine, b_refine) and a refined infrared-channel image (e.g., ir_refine) by reducing crosstalk between different channels of the image sensor. For example, operational steps to reduce the interference or noise may be performed according to the equations below. First, to obtain a refined infrared-channel image, noise from light of other colors may be obtained according to equation (4) below:

$$\text{color\_ir} = \begin{cases} \text{raw\_color} \times \text{color\_scale}, & \text{raw\_color} > \text{raw\_ir} \\ 0 & \text{otherwise} \end{cases} \quad (4)$$

where color_ir represents the estimated undesirable response or noise of other color light in the infrared channel, such as red_r, raw_g, and raw_b, raw_color represents the obtained color-channel images, such as raw_r, raw_g, and raw_b, and color_scale represents the degree of interference, crosstalk, or noise level contributed by the particular color. For example, color_scale for red, green, and blue color light are represented by r_scale, g_scale, and b_scale. The values of color_scale may be determined by various factors, such as the quantum efficiency of each channel of image sensor 120a, the light intensity of each color of light received by image sensor 120, and/or other suitable parameters of system 100. For example, the values of color_scale may range from about 0 to about 1. The value of r_scale may be around 0.25, the value of g_scale may be around 0.125, and the value of b_scale may be around 0.25.

After color_ir is obtained for all the relevant colors of light, the total noise color_sum_ir from different colors of light contributing to the infrared channel can be obtained according to equation (5) below:

$$\text{color\_sum\_ir} = \text{red\_ir} + \text{green\_ir} + \text{blue\_ir}. \quad (5)$$

A refined infrared-channel image can be obtained according to equation (6) below:

$$\text{ir\_refine} = \begin{cases} \text{raw\_ir} - \text{color\_sum\_ir}, & \text{raw\_ir} > \text{color\_sum\_ir} \\ 0 & \text{otherwise} \end{cases} \quad (6)$$

Second, to obtain refined color-channel images, a color-channel image without the contribution of infrared light of a particular color channel may be obtained according to equation (7) below:

$$\text{color\_value} = \begin{cases} \text{raw\_color} - \text{raw\_ir}, & \text{raw\_color} > \text{raw\_ir} \\ 0 & \text{otherwise} \end{cases} \quad (7)$$

where color_value represents an estimate of the intensity of color light captured without the contribution of infrared light of a particular color channel. Therefore, the refined color-channel images may be obtained according to equations (8-10) below by reducing the contribution from other color light in the particular color channel:

$$\text{g\_refine} = \quad (8)$$
$$\begin{cases} \text{g\_value} - \text{r\_value} - \text{b\_value}, & \text{g\_value} > \text{r\_value} + \text{b\_value} \\ 0 & \text{otherwise} \end{cases}$$

$$\text{r\_refine} = \quad (9)$$
$$\begin{cases} \text{r\_value} - \text{g\_value} - \text{b\_value}, & \text{r\_value} > \text{g\_value} + \text{b\_value} \\ 0 & \text{otherwise} \end{cases}$$

$$\text{b\_refine} = \quad (10)$$
$$\begin{cases} \text{b\_value} - \text{g\_value} - \text{r\_value}, & \text{b\_value} > \text{g\_value} + \text{r\_value} \\ 0 & \text{otherwise} \end{cases}$$

where r_refine represents the filtered refined red-channel image, g_refine represents the filtered refined green-channel image, and b_refine represents the filtered refined blue-channel image.

In some situations, light blob 112 may emit light of a mixed color of red, green, and/or blue for identification purposes (e.g., for increasing unique light blobs 112 in system 100 with different color identity), and mixed color-channel images may be obtained. For example, a mixed green and blue refined image may be obtained according to equation (11) below:

$$\text{gb\_refine} = \quad (11)$$
$$\begin{cases} \dfrac{\text{b\_value} + \text{g\_value}}{2}, & \begin{array}{l} \text{g\_value} > \text{r\_value} + \text{kcolor\_threshold} \\ \text{and} \\ \text{b\_value} > \text{r\_value} + \text{kcolor\_threshold} \end{array} \\ 0 & \text{otherwise} \end{cases}$$

where gb_refine represents the filtered refined mixed green and blue-channel image. Filtered refined mixed green and red-channel image, e.g., gr_refine, and filtered refined mixed red and blue-channel image. e.g., rb_refine may be obtained similarly. The value of kcolor_threshold may be determined based on a plurality of parameters of system 100, including exposure time of image sensor 120a, and power or intensity of one or more LEDs of light blob 112. In some cases, the value for kcolor_threshold, may range from about 15 to about 25, e.g., about 20.

In step 330b, features of light blob 112 in the obtained refined images, e.g., r_refine, g_refine, b_refine, ir_refine, gb_refine, gr_refine, rb_refine, may be extracted through a set of predetermined operations. The features may include segments, contours, central locations, estimated sizes, e.g., radii or diameters, of light blob 112 in these images. Step 330b may include the following steps.

First, the refined images are filtered to reduce noise in the images. As a non-limiting example, a 3 by 3 mean filter may be used to apply mean filtering to the images. Any suitable method for reducing the noise in the refined color and infrared-channel images may be used.

Second, the filtered refined images are subjected to thresholding to create binary images to detect pixels that capture intensity of light blob 112. For example, for the filtered ir_refine, if the intensity of a pixel in the image is less than a predetermined threshold value, represented by e.g., kir_threshold, the pixel is replaced with a black pixel or its intensity is designated as zero, or a white pixel if the intensity is greater than the predetermined threshold value. Similarly, for the filtered refined color-channel images, r_refine, g_refine, b_refine, gb_refine, gr_refine, rb_refine, a kcolor_threshold is used for thresholding these images to binary images respectively. Segments of light blob 112 in the images may be detected as connected regions in the images consisting of white pixels whose adjacent 8 neighbouring pixels are also white pixels, for example. The values of kir_threshold may also be determined based on a plurality of parameters of system 100, including exposure time of image sensor 120a, power or intensity of an infrared LED of light blob 112. In some cases, the value of kir_threshold may be greater than kcolor_threshold.

Third, the detected segments of light blob 112 in each filtered refined image may be filtered to obtain effective segments. For example, the areas of the detected segments of light blob 112 may be compared with a lower threshold, karea_min. Segments having an area smaller than karea_min are regarded as ineffective segments. Segments having an area greater than and/or equal to karea_min are regarded as effective segments. The value of karea_min may be determined based on various factors, such as the size of the blob or blub of light blob 112, the distance between light blob 112 and image sensor 120*a*, and the size of image sensor 120*a*. In some cases, the value of karea_min may range from about 1 to about 3, e.g., about 2. The effective segments of light blob 112 may be represented by r_segments, g_segments, b_segments, gb_segments, gr_segments, rb_segments, and ir_segments for each filtered refined image respectively. The effective segments (r_segments, g_segments, b_segments, gb_segments, gr_segments, rb_segments) of light blob 112 in the refined color-channel images may be referred to as color_segments for the purpose of description. As described herein, operations performed on one filtered refined image of one color may be similarly performed on filtered refined image of another color.

In other embodiments, the contours of the segments may alternatively be used for identifying light blob 112 in the filtered refined images.

In step 340*b*, system 100 may be configured to determine at least one set of characteristic parameters in each refined color-channel image and/or each refined mixed color-channel image. For example, first, each of the effective segments in ir_segments is compared with each effective segment in a color_segments (e.g., r_segments, g_segments, b_segments, gb_segments, gr_segments, rb_segments). Segments in the ir_segments and color_segments that have overlapping regions are recorded in a set represented by ir_cross. This step allows for identifying the segments that have responses in both a color-channel image and the infrared-channel image.

Second, each of the segments in a color_segments is compared with each segment saved in ir_cross, and segments in the color_segments that have overlapping regions with the segments in ir_cross are recorded in a set represented by color_cross.

Third, the area of a segment in ir_cross and the area of a corresponding segment in color_cross (that overlaps with the segment in ir_cross) are calculated respectively as ir_area and color_area. A ratio between the areas are calculated as scale_area=color_area/ir_area.

Fourth, the positions of the centers and sizes of the segments in color_segments are calculated. For example, the center of a segment in color_segment may be calculated according to equation (12) below:

$$\text{center}=((Min_x+Max_x)/2,(Min_y+Max_y))/2 \quad (12)$$

where Minx is the smallest coordinate or pixel number of the segment along the horizontal axis, Maxx is the largest coordinate or pixel number of the segment along the horizontal axis, Miny is the smallest coordinate or pixel number of the segment along the vertical axis, and Maxy is the largest coordinate or pixel number of the segment along the vertical axis. The diameter of a segment in color_segment may be calculated according to equation (13) below:

$$\text{diameter}=\max((Max_x-Min_x),(Max_y-Min_y)) \quad (13)$$

Finally, sets of characteristic parameters in each refined color-channel image of light blob 112 are obtained based on the detected effective segments and their features, e.g., center, diameter, color_area, and scale area. The sets of characteristic parameters of light blob 112 in the filtered refined color-channel images may be represented by r_id, g_id, b_id, gr_i, rb_id, gb_id, respectively for description. Each set of characteristic parameters may include various determined parameters of the segments of light blob 112, including color_area, scale_area, center, and diameter. The identity of light blob 112 may then be obtained based on the information in color_id, e.g., r_id, g_id, b_id, gr_i, rb_id, gb_id.

In step 350*b*, system 100 may be configured to determine at least one final set of characteristic parameters indicative of the identity of light blob 112 based on the previously determined sets of characteristic parameters.

First, the segments in each color_id are filtered by comparing scale_area with a thresholding range defined by a minimum area threshold and a maximum area threshold, represented by kmin_area_scale and kmax_area_scale respectively. The segments having a scale_area that is greater than kmin_area_scale and smaller than kmax_area_scale are kept in color_id, while those outside of the threshold region are removed from color_id. The values of kmin_area_scale and kmax_area_scale may be determined based on various parameters of system 100, including exposure time of image sensor 120*a*, power or intensity of an infrared LED of light blob 112, distance between light blob 112 and image sensor 120*a*, and interference caused by ambient light or light blob. For example, the value of kmin_area_scale may range from about 0 to about 1, e.g., may be about 0.2. The value of kmax_area_scale may be set as 1/kmin_area_scale.

Because light blob 112 may emit visible light of a single color or a mixed color for identification purposes, the determination of the final set of characteristic parameters indicative of the identity of light blob 112 includes operations to differentiate whether light blob 112 is a single-color light blob 112 or a mixed-color light blob 112.

For mixed-color light blob 112, segments of mixed color-channel images, the color_id, e.g., gr_id, rb_id, and gb_id, may be filtered based on a parameter k. If the scale_area of a segment in color_id is smaller than k, then a segment in color_id having the largest color_area is regarded as the segment of light blob 112. If the scale_area of a segment in color_id is larger than k, then a segment in color_id having the smallest color_area is regarded as the segment of light blob 112. Then if two segments in two color_id, e.g., gr_id and gb_id, have overlapping regions, i.e., the distance between the centers of these two segments is smaller than half of the sum of the diameters of these two segments, the two segments are removed, otherwise, they remain in the color_id. The information of the remaining segments are recorded in gr_id_final, rb_id_final, and gb_id_final, and obtained as the final sets of characteristic parameters indicative of the identity of light blob 112.

For single-color light blob 112, segments of single color-channel images, the color_id, e.g., r_id, b_id, and g_id, may similarly be filtered based on a parameter k. Additionally, the segments in r_id, b_id, and g_id may be compared with the segments in gr_id, rb_id, and gb_id to determine if there are overlapping segments between single color-channel images and mixed color-channel images. The color_id of the determined overlapping segments are removed from the color_id sets of single color-channel images, but remain in the color_id sets of mixed color-channel images. The information of the remaining segments are recorded in r_id_final, b_id_final, and g_id_final, and obtained as the final sets of characteristic parameters indicative of the identity of light blob 112.

Accordingly, the identity of light blob 112 can be obtained based on the final sets of characteristic parameters indicative of the identity of light blob 112.

In step 360*b*, system 100 may be configured to determine a center position of light blob 112 based on the final sets of characteristic parameters, e.g., r_id_final, b_id_final, g_id_final, gr_id_final, rb_id_final, and gb_id_final, according to equation (14) below:

$$\begin{cases} x = \dfrac{\sum\limits_{i=-radius}^{radius}\sum\limits_{j=-radius}^{radius} \text{raw\_filter\_img}(center \cdot x + i, center \cdot y + j) \cdot (center \cdot x + i)}{\sum\limits_{i=-radius}^{radius}\sum\limits_{j=-radius}^{radius} \text{raw\_filter\_img}(center \cdot x + i, center \cdot y + j)} \\ y = \dfrac{\sum\limits_{i=-radius}^{radius}\sum\limits_{j=-radius}^{radius} \text{raw\_filter\_img}(center \cdot x + i, center \cdot y + j) * (center \cdot y + i)}{\sum\limits_{i=-radius}^{radius}\sum\limits_{j=-radius}^{radius} \text{raw\_filter\_img}(center \cdot x + i, center \cdot y + j)} \end{cases} \quad (14)$$

wherein raw_filter_img represents filtered raw image obtained by image sensor 120a.

In some aspects, the raw image obtained by image sensor 120a may be processed or filtered. For example, the raw image may be blurred by using a box blur filter or a Gaussian blue filter to reduce noise and/or detail, which may enhance the structure of light blob 112 in the raw image. The obtained blurred raw image may be referred to herein as raw_filter_img. As a non-limiting example, a box blur filter may be a 5 by 5 low pass filter. The pixels of the resulting raw_filter_img may have a value equal to the average value of its neighboring pixels in the raw image. As a further nonlimiting example, a Gaussian blur may be a Gaussian function, and to apply a Gaussian filter to the raw image may be achieved by convolving the image with the Gaussian function.

Then, the spatial position of light blob 112 is determined based on the position of the centers of the segments in the final sets of characteristic parameters indicative of the identity of light blob 112 (e.g., color_id_final). For example, after the identity of light blob 112 is obtained in the raw images acquired by both sensors 120a and 120b, based on the identity of light blob 112 and/or the raw images, suitable 3D position tracking or determination methods can be used to determine the spatial position of light blob 112. The spatial position of light blob 112 may then be sent to a mobile computing device, such as a VR headset.

The foregoing description has been presented for purposes of illustration. It is not exhaustive and is not limited to precise forms or embodiments disclosed. Modifications and adaptations of the embodiments will be apparent from consideration of the specification and practice of the disclosed embodiments. For example, the described implementations include hardware and software, but systems and methods consistent with the present disclosure can be implemented as hardware or software alone. In addition, while certain components have been described as being coupled or operatively connected to one another, such components may be integrated with one another or distributed in any suitable fashion.

Moreover, while illustrative embodiments have been described herein, the scope includes any and all embodiments having equivalent elements, modifications, omissions, combinations (e.g., of aspects across various embodiments), adaptations and/or alterations based on the present disclosure. The elements in the claims are to be interpreted broadly based on the language employed in the claims and not limited to examples described in the present specification or during the prosecution of the application, which examples are to be construed as nonexclusive. Further, the steps of the disclosed methods can be modified in any manner, including reordering steps and/or inserting or deleting steps.

Instructions or operational steps stored by a computer-readable medium may be in the form of computer programs, program modules, or codes. As described herein, computer programs, program modules, and code based on the written description of this specification, such as those used by the controller, are readily within the purview of a software developer. The computer programs, program modules, or code can be created using a variety of programming techniques. For example, they can be designed in or by means of Java, C, C++, assembly language, or any such programming languages. One or more of such programs, modules, or code can be integrated into a device system or existing communications software. The programs, modules, or code can also be implemented or replicated as firmware or circuit logic.

The features and advantages of the disclosure are apparent from the detailed specification, and thus, it is intended that the appended claims cover all systems and methods falling within the true spirit and scope of the disclosure. As used herein, the indefinite articles "a" and "an" mean "one or more." Similarly, the use of a plural term does not necessarily denote a plurality unless it is unambiguous in the given context. Words such as "and" or "or" mean "and/or" unless specifically directed otherwise. Further, since numerous modifications and variations will readily occur from studying the present disclosure, it is not desired to limit the disclosure to the exact construction and operation illustrated and described, and accordingly, all suitable modifications and equivalents may be resorted to, falling within the scope of the disclosure.

For the purposes of the detailed specification and appended claims, unless otherwise indicated, all numbers expressing quantities, percentages, or proportions, and other numerical values used in the specification and claims, are to be understood as being modified in all instances by the term "about," to the extent they are not already so modified. Accordingly, unless indicated to the contrary, the numerical parameters set forth in the following specification and attached claims are approximations that may vary depending upon the desired properties sought to be obtained.

In some aspects, methods consistent with disclosed embodiments may exclude disclosed method steps, or may vary the disclosed sequence of method steps or the disclosed degree of separation between method steps. For example, method steps may be omitted, repeated, or combined, as necessary, to achieve the same or similar objectives. In various aspects, non-transitory computer-readable media may store instructions for performing methods consistent with disclosed embodiments that exclude disclosed method steps, or vary the disclosed sequence of method steps or disclosed degree of separation between method steps. For example, non-transitory computer-readable media may store instructions for performing methods consistent with disclosed embodiments that omit, repeat, or combine, as necessary, method steps to achieve the same or similar objectives. In certain aspects, systems need not necessarily include every disclosed part, and may include other undisclosed parts. For example, systems may omit, repeat, or combine, as necessary, parts to achieve the same or similar objectives.

Other embodiments will be apparent from consideration of the specification and practice of the embodiments disclosed herein. It is intended that the specification and examples be considered as example only, with a true scope and spirit of the disclosed embodiments being indicated by the following claims.

What is claimed is:

1. An electronic tracking device, comprising:
   at least one image sensor configured for sensing a raw image of at least one object, wherein the at least one object emits a color visible light encoding an identity of the at least one object and an infrared light, the at least one object is configured to emit light of one or more colors for carrying an identification of the at least one object, and the identification of the at least one object is encoded with the color of the color visible light, an additional characteristic information for identifying the at least one object is provided by the infrared light; the at least one image sensor comprises a color filter array so as to sense the color visible light and the infrared light from the at least one object through the color filter array to acquire the raw image of the at least one object, and the color filter array comprises at least one color filter channel and an infrared filter channel; and
   at least one processor configured for processing the raw image of the at least one object, and configured to determine the identity of the at least one object based on the color visible light and the infrared light from the at least one object, and further configured to determine a spatial position of the at least one object in accordance with the raw image.

2. The electronic tracking device as claimed in claim 1, wherein the at least one color filter channel of the color filter array comprises three color filter channels having different spectral transmission regions.

3. The electronic tracking device as claimed in claim 2, wherein the color filter array is a RGB-IR filter array.

4. The electronic tracking device as claimed in claim 1, wherein the color visible light is either a monochromatic visible light or a polychromatic visible light.

5. The electronic tracking device as claimed in claim 1, further comprising an inertial measurement unit installed in the at least one object and communicated with the processing device.

6. The electronic tracking device as claimed in claim 1, wherein the at least one processor comprises:
   a preprocessor configured for processing the raw image to obtain the at least one preprocessed color-channel image and the preprocessed infrared-channel image;
   a postprocessor configured for processing the at least one preprocessed color-channel image and the preprocessed infrared-channel image to obtain an identity information of the at least one object and a spatial position information; and
   a microcontroller communicated with the preprocessor and the postprocessor and configured for receiving the at least one preprocessed color-channel image and the preprocessed infrared-channel image from the preprocessor to the postprocessor, and for controlling the at least one image sensor to acquire the raw image of the at least one object.

7. An electronic tracking system, comprising:
   a light blob generator configured for forming at least one light blob, wherein the at least one light blob emits a color visible light and an infrared light, the at least one light blob is configured to emit light of one or more colors for carrying an identification of the at least one light blob, and the identification of the at least one light blob is encoded with the color of the color visible light, an additional characteristic information for identifying the at least one light blob is provided by the infrared light;
   at least one image sensor configured for sensing a raw image of at least one light blob, wherein the at least one image sensor comprises a color filter array so as to sense the color visible light and the infrared light from the at least one light blob through the color filter array to acquire the raw image of the at least one light blob, and the color filter array comprises at least one color filter channel and an infrared filter channel; and
   at least one processor configured for processing the raw image of the light blob, and configured to determine the identity of the at least one light blob based on the color visible light and the infrared light from the at least one light blob, and further configured to determine a spatial position of the at least one light blob in accordance with the raw image.

8. The electronic tracking system as claimed in claim 7, wherein the light blob generator comprises at least one light bulb that emits visible light of at least one color and an infrared light, the light bulb comprises at least one color LED for emitting the color visible light and at least one infrared LED for emitting the infrared light.

9. The electronic tracking system as claimed in claim 7, wherein the at least one color filter channel of the color filter array comprises three color filter channels having different spectral transmission regions, the color filter array is a RGB-IR filter array.

10. The electronic tracking system as claimed in claim 7, wherein the at least one light blob comprises a plurality of light blobs, the colors of the color visible lights from the plurality of light blobs are diffident, the identification of each of the plurality of light blobs is unique.

11. The electronic tracking system as claimed in claim 7, wherein the color visible light is either a monochromatic visible light or a polychromatic visible light.

12. The electronic tracking system as claimed in claim 7, further comprising an input device and an inertial measurement unit, wherein the inertial measurement unit is installed in the input device and communicated with the at least one processor, and the light blob generator is disposed on the input device.

13. The electronic tracking system as claimed in claim 7, wherein the at least one processor comprises:
   a preprocessor configured for processing the raw image to obtain the at least one preprocessed color-channel image and the preprocessed infrared-channel image;
   a postprocessor configured for processing the at least one preprocessed color-channel image and the preprocessed infrared-channel image to obtain an identity information of the at least one light blob and a spatial position information; and
   a microcontroller communicated with the preprocessor and the postprocessor, and configured for receiving the at least one preprocessed color-channel image and the preprocessed infrared-channel image from the preprocessor to the postprocessor and for controlling the at least one image sensor to acquire the raw image of the at least one light blob.

14. The electronic tracking system as claimed in claim 7, further comprising a mobile computing device communicated with the at least one processor.

15. An electronic tracking method, comprising:
   acquiring a raw image of at least one object, wherein the at least one object emits a color visible light encoding the identity of the at least one object and an infrared light, the at least one object is configured to emit light of one or more colors for carrying an identification of the at least one object, and the identification of the at least one object is encoded with the color of the color visible light, an additional characteristic information for identifying the at least one object is provided by the infrared light, the color visible light and the infrared light from the at least one object passes through a color filter array to be sensed to form the raw image, and the color filter array comprises at least one color filter channel and an infrared filter channel; and processing the raw image of the at least one object so as to determine the identity of the at least one object based on the color visible light and the infrared light from the at least one object, and determining a spatial position of the at least one object in accordance with the raw image.

16. The electronic tracking method as claimed in claim 15, wherein the step of processing the raw image to determine the identity of the at least one object further comprises:

splitting the raw image of the at least one object to form at least one color-channel image and an infrared-channel image;

filtering the at least one color-channel image and the infrared-channel image to reduce the crosstalk so as to form at least one refined color-channel image and a refined infrared-channel image;

thresholding the at least one refined color-channel image and the refined infrared-channel image to form at least one binary color-channel image and a binary infrared-channel image;

detecting and determining at least one effective segment in the at least one binary color-channel image and the binary infrared-channel image base on the degree of roundness of a plurality of detected segments;

obtaining at least one overlapping region between the at least one effective segment of the at least one binary color-channel image and the at least one effective segment of the binary infrared-channel image; and calculating at least one overlapping rate between an area of the at least one overlapping region corresponding to the at least one binary color-channel image and an area of the at least one effective segment of the binary infrared-channel image; and determining the identity of the at least one object in accordance with the at least one overlapping rate.

17. The electronic tracking method as claimed in claim 15, wherein the step of processing the raw image to determine the spatial position of the at least one object further comprises:

splitting the raw image of the at least one object to form at least one color-channel image and an infrared-channel image;

filtering the at least one color-channel image and the infrared-channel image to reduce the crosstalk so as to form at least one refined color-channel image and a refined infrared-channel image;

thresholding the at least one refined color-channel image and the refined infrared-channel image to form at least one binary color-channel image and a binary infrared-channel image;

detecting and determining at least one effective segment in the at least one binary color-channel image and the binary infrared-channel image base on a threshold area of connection region;

extracting at least one characteristic parameter of at least one effective segment in the at least one binary color-channel image; and determining the identity of the at least one object in accordance with the at least one characteristic parameter.

18. The electronic tracking method as claimed in claim 17, wherein the at least one characteristic parameter is selected from contour, center, diameter, color area and scale area.

19. The electronic tracking method as claimed in claim 17, wherein the step of extracting at least one characteristic parameter comprising obtaining at least one final set of characteristic parameters from the at least one characteristic parameter base on a monochromatic visible light or a polychromatic visible light.

20. The electronic tracking method as claimed in claim 19, wherein the step of processing the raw image to determine the spatial position of the at least one object further comprises:

calculating a center position of the at least one object based on the at least final set of characteristic parameters; and determining the spatial position of the at least one object in accordance with the central position.

* * * * *